(12) United States Patent
Honmatsu et al.

(10) Patent No.: US 11,316,517 B2
(45) Date of Patent: Apr. 26, 2022

(54) INPUT OPERATION DEVICE

(71) Applicant: SEKISUI POLYMATECH CO., LTD., Saitama (JP)

(72) Inventors: Yoshifumi Honmatsu, Saitama (JP); Kouta Yamazaki, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 0 days.

(21) Appl. No.: 16/756,258

(22) PCT Filed: Oct. 22, 2018

(86) PCT No.: PCT/JP2018/039221
§ 371 (c)(1),
(2) Date: Apr. 15, 2020

(87) PCT Pub. No.: WO2019/093111
PCT Pub. Date: May 16, 2019

(65) Prior Publication Data
US 2020/0336143 A1  Oct. 22, 2020

(30) Foreign Application Priority Data
Nov. 9, 2017  (JP) .............................. JP2017-216743

(51) Int. Cl.
*H03K 17/975* (2006.01)
*H03K 17/96* (2006.01)

(52) U.S. Cl.
CPC .................... *H03K 17/9622* (2013.01); *H03K 2217/96015* (2013.01)

(58) Field of Classification Search
CPC ..... H03K 17/962; H03K 2217/960755; H03K 17/9622; H03K 17/975; H03K 2017/9602;
(Continued)

(56) References Cited

U.S. PATENT DOCUMENTS

2002/0112942 A1\* 8/2002 Galmiche ............ H03K 17/962
200/5 R
2007/0164994 A1  7/2007 Inoue et al.
(Continued)

FOREIGN PATENT DOCUMENTS

CN  101004656 A  7/2007
CN  102262488 A  11/2011
(Continued)

OTHER PUBLICATIONS

International Search Report (PCT/ISA/210) dated Dec. 25, 2018, by the Japan Patent Office as the International Searching Authority for International Application No. PCT/JP2018/039221.
(Continued)

*Primary Examiner* — Ahmed M Saeed
(74) *Attorney, Agent, or Firm* — Cermak Nakajima & McGowan LLP; Tomoko Nakajima (57) ABSTRACT

To provide an input operation device capable of detecting, using a simple configuration, a first operation of touching an operation surface with an operation body and a second operation of pressing the operation surface with the operation body.

An input operation device 11 includes a detection value changing part 31, which changes a detection value of a capacitive sensor 12, and a supporting part 41, which supports a touch sensor part 21 in a state in which the detection value changing part 31 and the touch sensor part 21 are separated from each other. The detection value changing part 31 is arranged on a back surface 24 side opposite to the operation surface 22 of the touch sensor part 21, and changes the detection value depending on contact with the detection part 23. The supporting part 41 includes an elastically shape-changeable part 42, which elastically changes shape so as to bring the detection part 23 into contact with the detection value changing part 31 in
(Continued)

response to pressing of the operation surface 22. The capacitive sensor 12 of the input operation device 11 generates a first detection value indicating a first operation of touching the operation surface 22 and a second detection value indicating a second operation of pressing the operation surface 22 toward the detection value changing part 31.

13 Claims, 7 Drawing Sheets

(58) Field of Classification Search
CPC .......... H03K 2017/9613; H03K 17/955; G06F 3/0446; G06F 3/0445; G06F 3/0443
See application file for complete search history.

(56) References Cited

U.S. PATENT DOCUMENTS

| | | | |
|---|---|---|---|
| 2013/0161179 | A1 | 6/2013 | Tamura et al. |
| 2014/0292699 | A1 | 10/2014 | Ando |
| 2014/0354305 | A1 | 12/2014 | Hanssen et al. |
| 2015/0129408 | A1* | 5/2015 | Sergi .................. H03K 17/9622 200/600 |
| 2016/0191056 | A1 | 6/2016 | Kataoka et al. |
| 2016/0195994 | A1 | 7/2016 | Kitada et al. |
| 2016/0239101 | A1 | 8/2016 | Sakamaki |

FOREIGN PATENT DOCUMENTS

| | | |
|---|---|---|
| CN | 203071904 U | 7/2013 |
| CN | 103988433 A | 8/2014 |
| CN | 105593793 A | 5/2016 |
| CN | 105730320 A | 7/2016 |
| CN | 106062676 A | 10/2016 |
| JP | 2006236694 A | 9/2006 |
| JP | 2013110057 A | 6/2013 |
| JP | 201522823 A | 2/2015 |
| JP | 2016149352 A | 8/2016 |
| JP | 201788105 A | 5/2017 |
| WO | 2015049837 A1 | 4/2015 |

OTHER PUBLICATIONS

Written Opinion (PCT/ISA/237) dated Dec. 25, 2018, by the Japan Patent Office as the International Searching Authority for International Application No. PCT/JP2018/039221.
Extended Search Report issued by the European Patent Office in corresponding European Patent Applicatino No. 18876856.8-1203 dated Apr. 16, 2021 (7 pages).
Office Action from Chinese Patent App. No. 201880067749.4 (dated Feb. 23, 2022) with English language translation thereof.

* cited by examiner

INPUT OPERATION DEVICE

TECHNICAL FIELD

The present invention relates to an input operation device.

BACKGROUND ART

Hitherto, there have been known input operation devices with a capacitive sensor. Patent Literature 1 discloses a multi-stage switch that combines a touch sensor part and a contact-type switch unit, the touch sensor part including a detection part of a capacitive sensor. In this multi-stage switch, an operation of pressing the touch sensor part with a finger that touches the touch sensor part is detected by electrical connection between a pair of electrodes arranged at positions different from the touch sensor part.

CITATION LIST

Patent Literature

PTL 1: Japanese Unexamined Patent Application Publication No. 2006-236694

SUMMARY OF INVENTION

Technical Problem

In the above-mentioned known input operation device with the capacitive sensor, although a first operation of touching an operation surface of the touch sensor part and a second operation of pressing the operation surface are detectable, the configuration tends to be complex due to the arrangement of the detection part of the capacitive sensor and the arrangement of the contact-type electrodes.

It is an object of the present invention to provide an input operation device capable of detecting, using a simple configuration, a first operation of touching an operation surface with an operation body and a second operation of pressing the operation surface with the operation body.

Solution to Problem

To achieve the above-mentioned object, the present invention is configured having the following features.

That is, the present invention relates to an input operation device with a capacitive sensor, including: a touch sensor part that includes an operation surface on which an input operation is performed, and a detection part of the capacitive sensor; a detection value changing part that is arranged on a back surface side opposite to the operation surface of the touch sensor part and that changes a detection value of the capacitive sensor depending on approaching or contact of the detection part; and a supporting part that supports the touch sensor part in a state in which the detection value changing part and the touch sensor part are separated from each other, wherein: the supporting part includes an elastically shape-changeable part that elastically changes shape so as to bring the detection part closer to or into contact with the detection value changing part in response to pressing of the operation surface, and the capacitive sensor generates a first detection value indicating a first operation of touching the operation surface and a second detection value indicating a second operation of pressing the operation surface toward the detection value changing part.

With this configuration, the detection part which detects the first detection value indicating the first operation and the second detection value indicating the second operation may be integrated with the touch sensor part.

In the input operation device, it is preferable that the supporting part include a base part; that the elastically shape-changeable part have a shape that extends from the base part toward the touch sensor part; and that the detection value changing part be surrounded by the elastically shape-changeable part.

With this configuration, the detection value changing part may be protected by the elastically shape-changeable part.

It is preferable that the input operation device include a plurality of the detection parts, a plurality of the supporting parts, and a plurality of the detection value changing parts, and that the supporting parts and the detection value changing parts be arranged with correspondence to each of the detection parts.

With this configuration, various inputs may be performed from a plurality of input operation positions on the touch sensor part.

It is preferable that the input operation device further include a light source that illuminates the operation surface in a case in which the first detection value is generated.

With this configuration, an operator who operates the input operation device may proceed to the second operation after confirming that the first operation has been reliably performed.

In the input operation device, it is preferable that the touch sensor part include a shield layer, and that the shield layer be arranged at a position that is closer to the operation surface than an electrode of the detection part and that partially overlaps the electrode of the detection part in plan view of the touch sensor part.

With this configuration, it become easier to define a detection value generated in response to the first operation of touching the operation surface with an operation body to be within a certain range. Accordingly, it becomes easier to make a detection value when the second operation of bringing the detection part into contact with the detection value changing part is performed different from a detection value when the first operation is performed.

In the input operation device, it is preferable that a shape of the shield layer be ring-shaped, and the capacitive sensor be configured to be capable of generating the first detection value through interior of the ring shape of the shield layer.

With this configuration, it become even easier to define a detection value generated in response to the first operation to be within a certain range. Accordingly, it becomes even easier to make a detection value when the second operation of bringing the detection part into contact with the detection value changing part is performed different from a detection value when the first operation is performed.

In the input operation device, it is preferable that the capacitive sensor include a first electrode that generates the first detection value and a second electrode that generates the second detection value, that the touch sensor part include a shield layer, and that the shield layer be arranged at a position that is closer to the operation surface than the second electrode and that overlaps the second electrode in plan view of the touch sensor part.

With this configuration, the detection value of the second electrode on the basis of contact between the detection part and the detection value changing part is less likely to be affected by the operation surface side opposite to the detection value changing part.

Advantageous Effects of Invention

According to the present invention, a first operation of touching an operation surface with an operation body and a second operation of pressing the operation surface with the operation body are detectable using a simple configuration.

BRIEF DESCRIPTION OF DRAWINGS

Parts (a) and (b) of FIG. 12 are schematic sectional views illustrating an input operation device of a sixth embodiment.

Parts (a) and (b) of FIG. 13 are schematic sectional views illustrating the input operation device of the sixth embodiment.

DESCRIPTION OF EMBODIMENTS

First Embodiment

A first embodiment of an input operation device with a capacitive sensor will be described.

Figure 1:
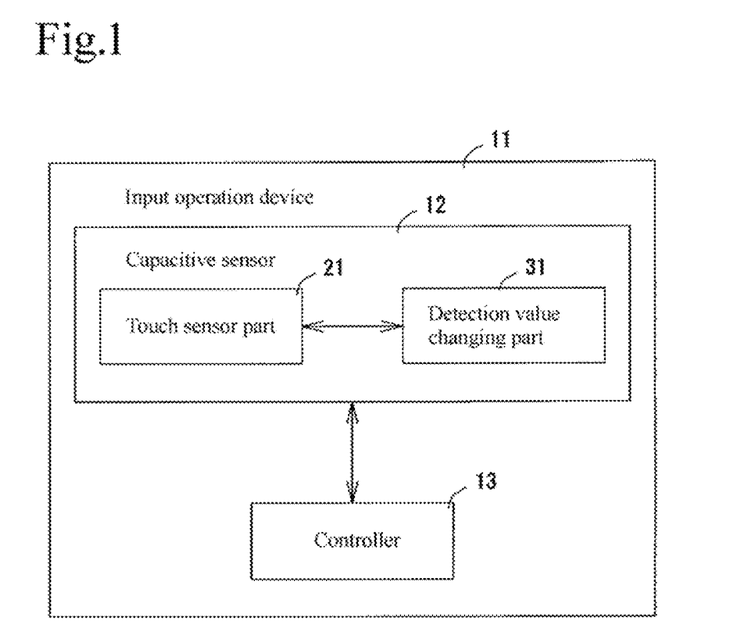
FIG. 1 is a functional block diagram illustrating an input operation device of the present embodiment.

As illustrated in FIG. 1, an input operation device 11 includes a capacitive sensor 12 and a controller 13. The capacitive sensor 12 has the function of detecting a change in capacitance when an operation body such as a finger comes closer to or further away from the capacitive sensor 12, and generating detection signals (a "first detection value" and a "second detection value"). Specifically, the capacitive sensor 12 includes a touch sensor part 21, a detection value changing part 31, and a supporting part 41.

The controller 13 has the function of determining, on the basis of the detection signals (the "first detection signal" and the "second detection signal") generated by the capacitive sensor 12, that the operation body has come closer to and further away from the capacitive sensor 12. The controller 13 as above includes, for example, a microcontroller.

Figure 2:
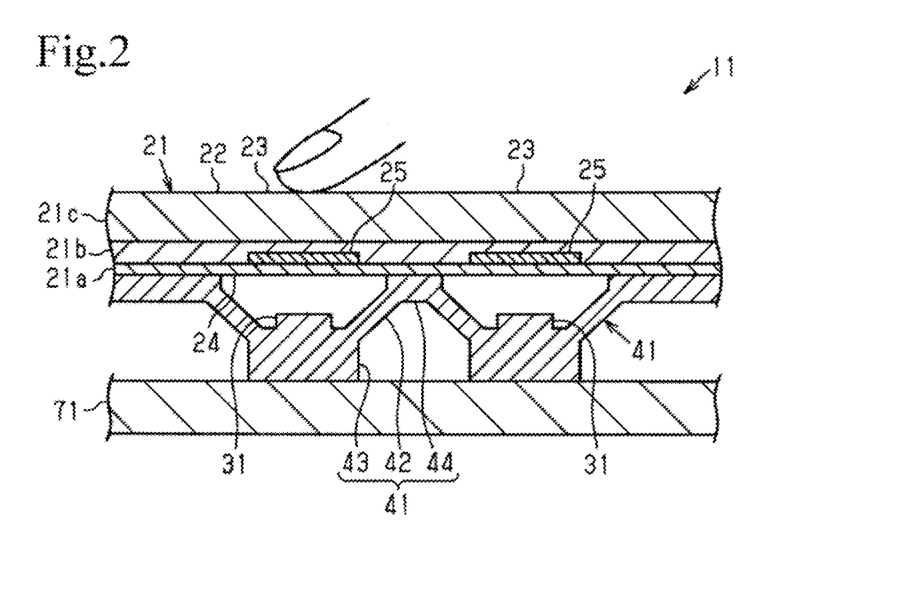
FIG. 2 is a schematic sectional view illustrating the input operation device of a first embodiment.

As illustrated in FIGS. 1 and 2, the input operation device 11 includes the touch sensor part 21. The touch sensor part 21 includes an operation surface 22, on which an input operation is performed by an operation body, and a detection part 23 of the capacitive sensor 12. The input operation device 11 further includes the detection value changing part 31, which changes the detection value of the capacitive sensor 12, and the supporting part 41, which supports the touch sensor part 21 in a state in which the detection value changing part 31 and the touch sensor part 21 are separated from each other. The detection value changing part 31 is arranged on a back surface 24 side which is opposite to the operation surface 22 of the touch sensor part 21, and changes the detection value depending on contact with the detection part 23. The supporting part 41 includes an elastically shape-changeable part 42, which elastically changes shape so as to bring the detection part 23 into contact with the detection value changing part 31 in response to pressing of the operation surface 22 toward the back surface 24 side. Hereinafter, a certain thing in plan view refers to the case in which the certain thing is viewed from the operation surface 22 side, which is an upper side of FIG. 2.

The input operation device 11 of the present embodiment includes a plurality of detection parts 23, a plurality of supporting parts 41, and a plurality of detection value changing parts 31. The supporting parts 41 and the detection value changing parts 31 are arranged with correspondence to each of the detection parts 23.

Touch Sensor Part 21

The touch sensor part 21 includes, sequentially from the back surface 24 side, a sheet base material 21a, the detection part 23, and a protective layer 21b, which protects the detection part 23. The touch sensor part 21 additionally includes a wiring circuit, which is not illustrated in the drawings. The touch sensor part 21 of the present embodiment further includes a decoration member 21c, which is laminated on the operation surface 22 side for the protective layer 21b. The decoration member 21c includes the above-mentioned operation surface 22.

The touch sensor part 21 has a sheet shape as a whole. It is preferable that the touch sensor part 21 be translucent. The sheet base material 21a and the protective layer 21b may be made of, for example, a resin material that is translucent and insulating.

The detection part 23 of the capacitive sensor 12 includes an electrode 25. The electrode 25 is arranged to be concentric in plan view with the base part 43 and the detection value changing part 31. An electrically conductive material for making the electrode 25 includes, for example, metal, alloy, carbon, graphite, and electrically conductive polymer. Note that the electrode 25 may be made from a thin film made of an electrically conductive material or a thin film formed from a polymer composition containing an electrically conductive material. As a method of forming the electrode 25 and wiring lines on the sheet base material 21a, methods such as printing, vapor deposition, sputtering, and plating may be used.

The decoration member 21c is provided to display characters, symbols, patterns, and so forth and to decorate the touch sensor part 21. With the decoration member 21c as above, for example, the position of the detection part 23 which overlaps in plan view may be visually recognized. The thickness and flexibility of the decoration member 21c may be adjusted to follow the shape change of the elastically shape-changeable part 42. It is preferable that the decoration member 21c be made from, for example, a rubbery elastic body or a relatively flexible resin film. By providing a recess or a cut in part of the decoration member 21c, the operation surface 22 may be pressed to appropriately allow the supporting part 41 to elastically change shape. To appropriately allow the supporting part 41 to elastically change shape, it is effective to arrange a reinforcement member at a position corresponding to the supporting part 41 on the outer surface of the decoration member 21c or between the decoration member 21c and the touch sensor part 21.

Detection Value Changing Part 31

The detection value changing part 31 is made from, for example, a rubbery elastic body. The supporting part 41 is provided with the detection value changing part 31 of the present embodiment. A tip surface (surface facing the operation surface 22) of the detection value changing part 31 may be made of an electrically conductive material. In this case, the amount Δ of change in capacitance of the capacitive sensor 12 may be further increased. Examples of the electrically conductive material include an electrically conductive coating film, a metal thin plate, and an electrically conductive rubber. The tip surface of the detection value changing part 31 may be formed by integrally providing an electrically conductive member such as an electrically conductive rubber at the tip of the detection value changing part main body having a protruding shape, or by applying (printing, dipping, etc.) an electrically conductive coating material to the tip surface of the detection value changing part main body. In addition, by increasing the area of the tip surface of the detection value changing part 31, the amount Δ of change in capacitance at the time the detection part 23 and the detection value changing part 31 are brought into contact with each other may be further increased.

Supporting Part 41

The supporting part 41 includes the base part 43, the elastically shape-changeable part 42, which extends from the base part 43 toward the touch sensor part 21, and a pressing force receiving part 44, which receives pressing force applied from the touch sensor part 21. The base part 43 is attached to, for example, an attachment portion 71 of a housing. The elastically shape-changeable part 42 is formed in a buckleable and changeable shape (skirt-like shape). In this case, at the time of a pressing operation of the operation surface 22, the elastically shape-changeable part 42 buckles and changes shape, thereby giving the operator the feel of a click operation. The pressing force receiving part 44 is attached to the back surface 24 of the touch sensor part 21. The pressing force receiving part 44 extends along the back surface 24 of the touch sensor part 21. It is preferable that the pressing force receiving part 44 be attached at a position not overlapping the detection part 23 of the touch sensor part 21 in plan view. Furthermore, it is preferable that the pressing force receiving part 44 be formed to be ring-shaped in plan view.

The supporting part 41 as a whole of the present embodiment is made from a rubbery elastic body. As the rubbery elastic body, for example, synthetic rubber such as silicone rubber or urethane rubber, or thermoplastic elastomer may be used.

Here, the above-described detection value changing part 31 is provided to protrude on the operation surface 22 side of the base part 43. The detection value changing part 31 is arranged between the touch sensor part 21 and the base part 43. The detection value changing part 31 is arranged to be surrounded by the elastically shape-changeable part 42. It is preferable that the detection value changing part 31 be entirely surrounded by the elastically shape-changeable part 42.

The detection value changing part 31 may be integrally molded with the supporting part 41. The detection value changing part 31 may be integrally molded with the supporting part 41 within one mold, or may be integrally molded by inserting the pre-molded detection value changing part 31 into a mold and molding the supporting part 41 within the mold. Alternatively, the detection value changing part 31 and the supporting part 41 may be separately molded and bonded to the base part 43.

Operation of Input Operation Device 11

Figure 3:
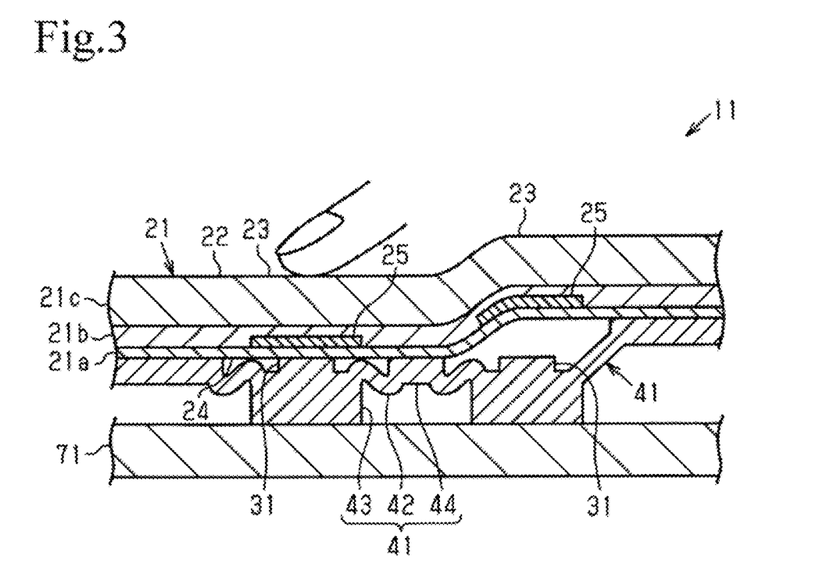
FIG. 3 is a schematic sectional view describing a second operation.

As illustrated in FIGS. 2 and 3, the input operation device 11 is configured to be capable of performing a first operation of touching the operation surface 22 with an operation body and a second operation of pressing the operation surface 22 toward the detection value changing part 31. In the second operation, the detection part 23 of the touch sensor part 21 contacts the detection value changing part 31. The input operation device 11 determines the first operation of touching the operation surface 22 with an operation body and the second operation of pressing the operation surface 22 toward the detection value changing part 31, on the basis of a detection value obtained by the detection part 23 of the capacitive sensor 12. More specifically, the capacitive sensor 12 of the input operation device 11 generates a "first detection value" indicating the first operation and a "second detection value" indicating the second operation. As a parameter of the "first detection value" and the "second detection value", for example, the amount Δ of change in capacitance that is based on when the first operation and the second operation are not performed is used. The controller 13 of the input operation device 11 determines whether the first operation and the second operation are performed, on the basis of the amount Δ of change in capacitance that is detected by the detection part 23. In the controller 13, a first threshold C1 for determining the first operation and a second threshold C2 for determining the second operation are set in advance. The controller 13 determines that the first operation has been performed on the basis of a comparison between the amount Δ of change in capacitance detected by the capacitive sensor 12 and the first threshold C1. The controller 13 determines that the second operation has been performed on the basis of a comparison between the amount Δ of change in capacitance detected by the capacitive sensor 12 and the second threshold C2.

Figure 4:
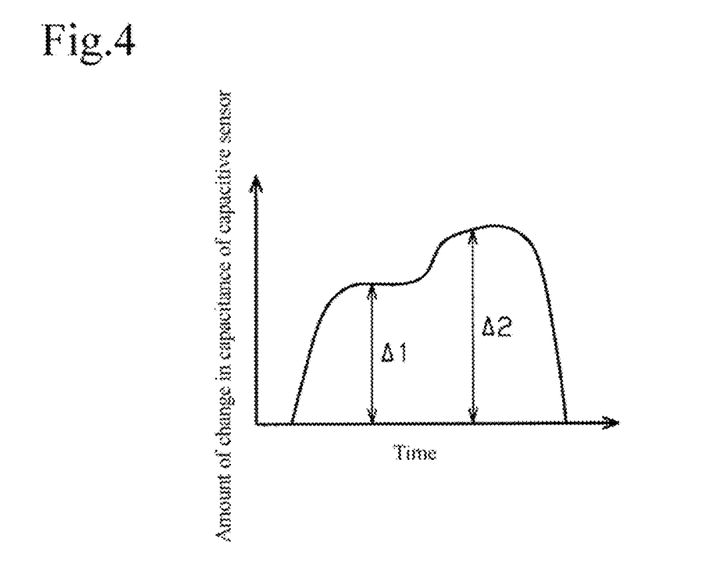
FIG. 4 is a graph that schematically illustrates the relationship between time and the amount of change in capacitance.

FIG. 4 illustrates the relationship between time and the amount Δ of change in capacitance of the capacitive sensor 12. Here, for the convenience of explanation, an example is discussed in which the speed at which the touch sensor part 21 (the operation surface 22) is pressed toward the detection value changing part 31 is constant.

In the input operation device 11, the amount of change in capacitance when a finger touches the detection part 23 (for example, Δ1 in FIG. 4 (Δ1≥C1)) and the amount of change in capacitance when the detection part 23 that the finger is touching is further brought into contact with the detection value changing part 31 (Δ2 in FIG. 4 (Δ2≥C2)) are different. Specifically, as the detection part 23 that the finger is touching approaches the detection value changing part 31, the amount Δ of change in capacitance increases, and, when the detection part 23 contacts the detection value changing part 31, the amount Δ of change in capacitance saturates at a substantially constant value. On the basis of such a difference between the amounts Δ of change in capacitance, the controller 13 may individually determine the first operation and the second operation. As described above, the "first detection value" is a value detectable on the basis of a comparison with the first threshold C1, and the "second detection value" is a value detectable on the basis of a comparison with the second threshold C2. The input operation device 11 may be configured to set the first threshold C1 and the second threshold C2 not on the basis of the amount Δ of change in capacitance, but on the basis of the absolute value of capacitance or another parameter derived from capacitance.

The balance between the amount Δ of change in capacitance in response to the first operation and the amount Δ of change in capacitance in response to the second operation is adjustable by the distance between the electrode 25 and the operation surface 22 included in the detection part 23 (thickness of the protective layer 21b and the decoration member 21c), or the thickness of the sheet base material 21a. Accordingly, the input operation device 11 may easily distinguish the first operation from the second operation.

In the controller 13 of the input operation device 11, a first detection signal obtained in the case where it is determined that the first operation has been performed is usable for, for example, notifying the operator of the fact that a certain position of the input operation device 11 (operation surface 22) has been touched. As means for notifying the operator, for example, sound, light, vibration, opening and closing a lid, and the like may be used. In the controller 13 of the input operation device 11, a second detection signal obtained in the case where it is determined that the second operation has been performed is usable for, for example, turning ON/OFF various devices and setting the state of various devices.

Next, the operation and advantageous effects of the first embodiment will be described.

(1-1) The input operation device 11 includes the touch sensor part 21 including the operation surface 22, on which an input operation is performed by an operation body such as a finger, and the detection part 23 of the capacitive sensor 12. The input operation device 11 further includes the detection value changing part 31, which is arranged on the back surface 24 side opposite to the operation surface 22 of the touch sensor part 21 and which changes the detection value of the capacitive sensor 12 depending on contact with the detection part 23, and the supporting part 41, which supports the touch sensor part 21 in a state in which the detection value changing part 31 and the touch sensor part 21 are separated from each other. The supporting part 41 includes the elastically shape-changeable part 42, which elastically changes shape so as to bring the detection part 23 into contact with the detection value changing part 31 in response to pressing of the operation surface 22 toward the back surface 24 side. The capacitive sensor 12 generates the first detection value indicating the first operation of touching the operation surface 22 with an operation body, and the second detection value indicating the second operation of pressing the operation surface 22 toward the detection value changing part 31.

With this configuration, the input operation device 11 may integrate the detection part 23, which detects the first operation and the second operation, with the touch sensor part 21. Therefore, the input operation device 11 may detect the first operation of touching the operation surface 22 and the second operation of pressing the operation surface 22 using a simple configuration.

(1-2) The supporting part 41 includes the base part 43. The elastically shape-changeable part 42 has a shape extending from the base part 43 toward the touch sensor part 21. The detection value changing part 31 is surrounded by the elastically shape-changeable part 42.

In this case, the input operation device 11 may protect the detection value changing part 31 with the elastically shape-changeable part 42. Thus, the input operation device 11 may prevent a foreign substance such as dust from adhering to the detection value changing part 31. Therefore, the input operation device 11 may enhance the reliability of detection of the second operation.

(1-3) The input operation device 11 includes a plurality of detection parts 23, a plurality of supporting parts 41, and a plurality of detection value changing parts 31. The supporting parts 41 and the detection value changing parts 31 are arranged with correspondence to each of the detection parts 23. In this case, the input operation device 11 is able to perform various inputs from a plurality of input operation positions on the touch sensor part 21.

Second Embodiment

Figure 5:
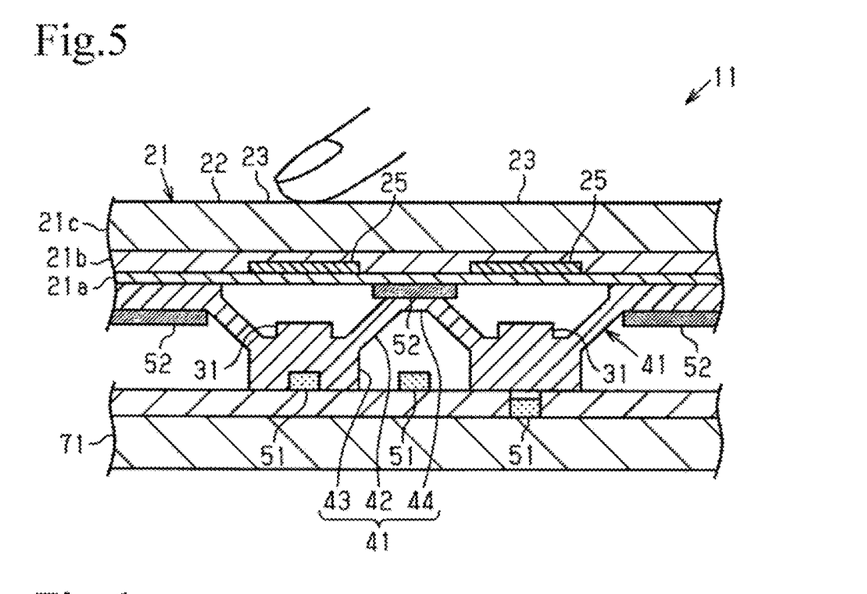
FIG. 5 is a schematic sectional view illustrating an input operation device of a second embodiment.

A second embodiment of the input operation device 11 will be described by focusing on points that are different from the above-described first embodiment. The touch sensor part 21 and the supporting part 41 of the input operation device 11 of the second embodiment are both translucent.

As illustrated in FIG. 5, the input operation device 11 further includes a light source 51, which illuminates the operation surface 22 in the case where the first detection value is generated and the first operation is determined. The light source 51 illuminates the operation surface 22 of the touch sensor part 21 through (penetrating through) the supporting part 41. That is, the input operation device 11 has a backlight function of the touch sensor part 21. As the light source 51, an LED (Light Emitting Diode) may be suitably used. The light source 51 is arranged between the attachment portion 71 and the supporting part 41. More specifically, the input operation device 11 may be provided with the light source 51 by arranging a circuit substrate provided with the light source 51 between the attachment portion 71 and the supporting part 41. The light source 51 of the input operation device 11 may be arranged in, for example, a recessed portion of the circuit substrate, in a recessed portion formed in the base part 43, or between the base part 43 and the base part 43 that are adjacent to each other.

The input operation device 11 further includes a light-blocking part 52. Using the light-blocking part 52, the input operation device 11 is able to illuminate a portion of the operation surface 22 of the touch sensor part 21 in a concentrated (spot-like) manner. The light-blocking part 52 may be provided between the decoration member 21c and the light source 51. Specifically, the supporting part 41, the sheet base material 21a or the protective layer 21b of the touch sensor part 21, or the like may be provided with the light-blocking part 52. The light-blocking part 52 may be formed from, for example, light-blocking coating.

Figure 6:
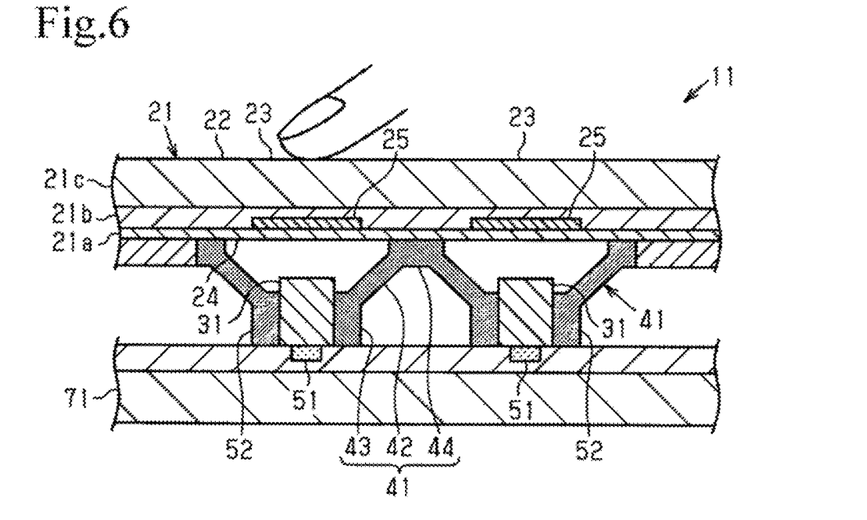
FIG. 6 is a schematic sectional view illustrating another input operation device of the second embodiment.

The configuration of the input operation device 11 including the light source 51 and the light-blocking part 52 may be changed as follows.

The input operation device 11 illustrated in FIG. 6 includes the light source 51 arranged between the attachment portion 71 and the base part 43. The center of the base part 43 in plan view and the detection value changing part 31 are translucent. In the supporting part 41, a portion of the base part 43 other than the center in plan view serves as the light-blocking part 52, and the light-blocking part 52 may be made of, for example, a black rubber material.

In the case of making the tip surface of the detection value changing part 31 from an electrically conductive material in order to increase the electrical conductivity of the tip surface, it is preferable that the shadow of the detection value changing part 31 be less likely to be visually recognized on the operation surface 22. To do so, it is preferable to make the tip surface of the detection value changing part 31 from an electrically conductive material formed in fine shapes such as lines, dots, meshes, or the like, or from a translucent electrically conductive material.

In addition, the light-blocking part 52 may be omitted in the input operation device 11 of the second embodiment.

Next, the operation of the input operation device 11 of the second embodiment will be described.

In the controller 13 of the input operation device 11, if it is determined that the first operation has been performed, illuminating the operation surface 22 from the light source 51 may notify the operator that a certain position of the operation surface 22 has been touched, that is, the first operation has been performed. In addition, the input operation device 11 may notify the operator that the first operation has been performed by displaying characters, a symbol, a pattern, or the like on the operation surface 22 by illuminating the decoration member 21c.

In the second embodiment, the following operation and advantageous effects may be achieved in addition to the operation and advantageous effects discussed in the above-described (1-1) to (1-3) paragraphs.

(2-1) The input operation device 11 further includes the above-described light source 51.

In this case, an operator who operates the input operation device 11 may proceed to the second operation after confirming that the first operation has been reliably performed. Therefore, the operator may reliably perform an input through the second operation. For example, the operator may reliably perform a series of operations including checking whether certain operation details have been selected on the basis of the illuminated display involved in the first operation, and confirming those operation details through the second operation.

(2-2) The input operation device 11 includes the light-blocking part 52, which blocks part of light emitted from the light source 51. In this case, the input operation device 11 is configured to be able to easily illuminate a certain position of the operation surface 22 in a concentrated manner.

Third Embodiment

Figure 7:
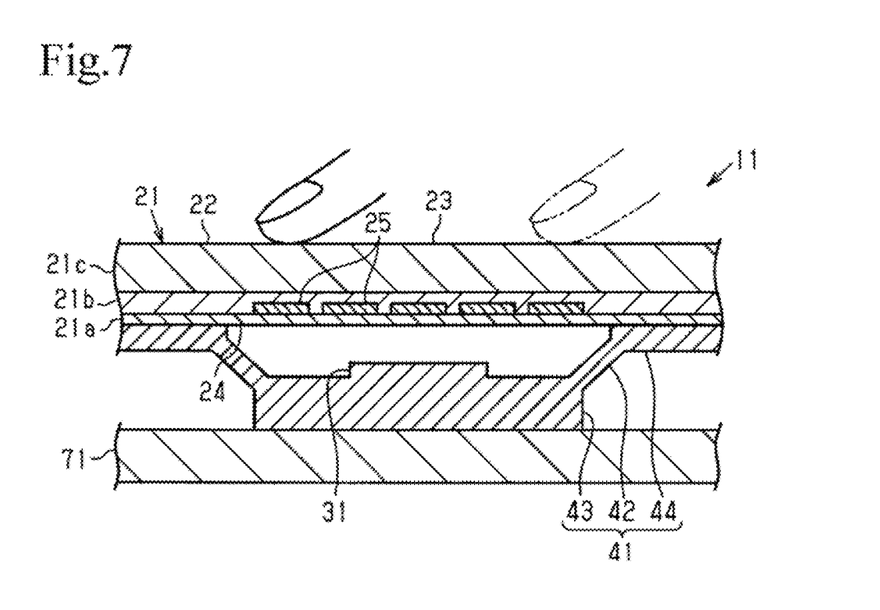
FIG. 7 is a schematic sectional view illustrating an input operation device of a third embodiment.
Figure 8:
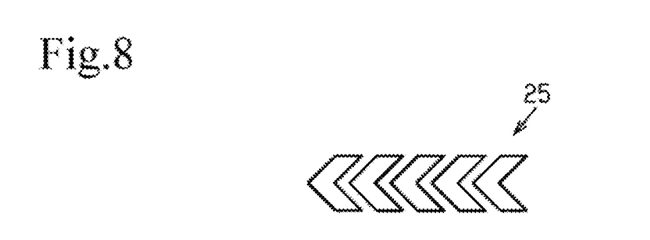
FIG. 8 is a schematic plan view illustrating exemplary electrodes of the input operation device.

A third embodiment of the input operation device 11 will be described by focusing on points that are different from the above-described first embodiment. The input operation device 11 of the third embodiment is configured to be able to perform a slider input (tracing input).

As illustrated in FIGS. 7 and 8, the detection part 23 for slider input of the input operation device 11 includes a plurality of electrodes 25 that are bent (V-shaped) in plan view, and these electrodes 25 are arranged in a straight line. The number of electrodes 25 may be changed according to the size (area) of each electrode 25 and the slider inputtable range. The input operation device 11 includes one supporting part 41 for a pair of detection parts 23 for slider input. The pressing force receiving part 44 of the supporting part 41 is arranged to surround a pair of detection parts 23 for slider input in plan view.

In the input operation device 11, the first operation includes not only touching the operation surface 22, but also a slider operation (tracing operation) of moving the finger touching the operation surface 22 along the detection parts 23 to input certain operation details. With this slider operation, for example, a slider input of selecting (choosing) specified operation details may be performed. In the second operation, for example, a confirming input of confirming the operation details selected by the first operation may be performed.

It is preferable that the decoration member 21c be made of a hard material (such as hard resin) so as not to bent when pressing the operation surface 22 with a finger. In this input operation device 11, at the time of the second operation of pressing the operation surface 22 toward the back surface 24 side after the first operation, the elastically shape-changeable part 42 buckles and changes shape, thereby giving the operator the feel of a click operation. Note that the controller 13 may determine the second operation using a detection value based on at least one electrode 25 among a plurality of electrodes 25 included in each detection part 23 for slider input.

In the third embodiment, the following operation and advantageous effects may be achieved in addition to the operation and advantageous effects discussed in the above-described (1-1) and (1-2) paragraphs.

(3-1) The input operation device 11 may perform various inputs such as choosing something using the first operation based on a slider input and the second operation of pressing the operation surface 22 toward the detection value changing part 31.

Fourth Embodiment

A fourth embodiment of the input operation device 11 will be described by focusing on points that are different from the above-described first embodiment and third embodiment.

Figure 9:
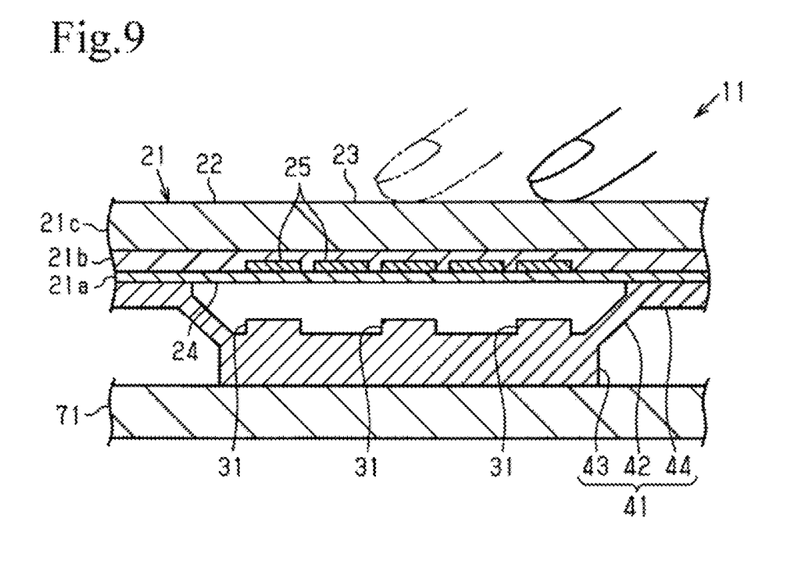
FIG. 9 is a schematic sectional view illustrating an input operation device of a fourth embodiment.

As illustrated in FIG. 9, the input operation device 11 of the fourth embodiment includes a plurality of detection value changing parts 31. The detection value changing parts (three detection value changing parts 31 in the present embodiment) are arranged in one-to-one correspondence with a plurality of electrodes 25 (three electrodes 25 among five electrodes 25 in the present embodiment) included in the detection part 23 for slider input. The number of detection value changing parts 31 may be changed to two or four or more. The longitudinal direction of the elastically shape-changeable part 42 provided corresponding to the detection part 23 for slider input is along the detection part 23.

In the case where an operation of pressing the operation surface 22 of the input operation device 11 toward the back surface 24 side (second operation) is performed, a detection value generated by each electrode 25 for slider input is different according to the tilt of the touch sensor part 21 being pressed. That is, in the case where the operation surface 22 is pressed so that the touch sensor part 21 will be tilted, there are one or more detection value changing parts 31 that are already in contact with the touch sensor part 21 and one or more detection value changing parts 31 that remain separated from the touch sensor part 21. In contrast, in the case where the entire operation surface 22 is pressed to the end so that the touch sensor part 21 will be horizontal, all of the detection value changing parts 31 contact the touch sensor part 21.

In the case where the operation surface 22 is pressed so that the touch sensor part 21 will be tilted, the elastically shape-changeable part 42 buckles partially, thereby giving the operator the feel of a click operation. In the case where the operation surface 22 is pressed to the end so that the touch sensor part 21 will be horizontal, the entire elastically shape-changeable part 42 buckles, thereby giving the operator the feel of a click operation. That is, in the case where the operation surface 22 is pressed so that the touch sensor part 21 will be tilted and then the operation surface 22 is pressed to the end so that the touch sensor part 21 will be horizontal, the elastically shape-changeable part 42 may give the operator the feel of a two-stage operation.

In the fourth embodiment, the following operation and advantageous effects may be achieved in addition to the operation and advantageous effects discussed in the above-described (1-1), (1-2), and (3-1) paragraphs.

(4-1) In the input operation device 11, the detection value detected by the detection part 23 is different in the case in which the operation surface 22 is pressed so that the touch sensor part 21 will be tilted and in the case in which the operation surface 22 is pressed to the end so that the touch sensor part 21 will be horizontal. Using such a difference between detection values, the controller 13 may determine, for example, only the case in which the operation surface 22 is pressed to the end so that the touch sensor part 21 will be horizontal as the second operation. Therefore, even if, at the time of a slider operation, the operation surface 22 is unintentionally pressed so that the touch sensor part 21 will be tilted, the operation may be prevented from being wrongly determined as the second operation.

(4-2) Using the difference between detection values in the above-mentioned case in which the operation surface 22 is pressed, the controller 13 may determine the second operation at multiple stages. Therefore, various inputs such as tentative pressing may be performed using a plurality of detection signals obtained from the second operation.

Fifth Embodiment

A fifth embodiment of the input operation device 11 will be described by focusing on points that are different from the above-described first embodiment.

Figure 10:
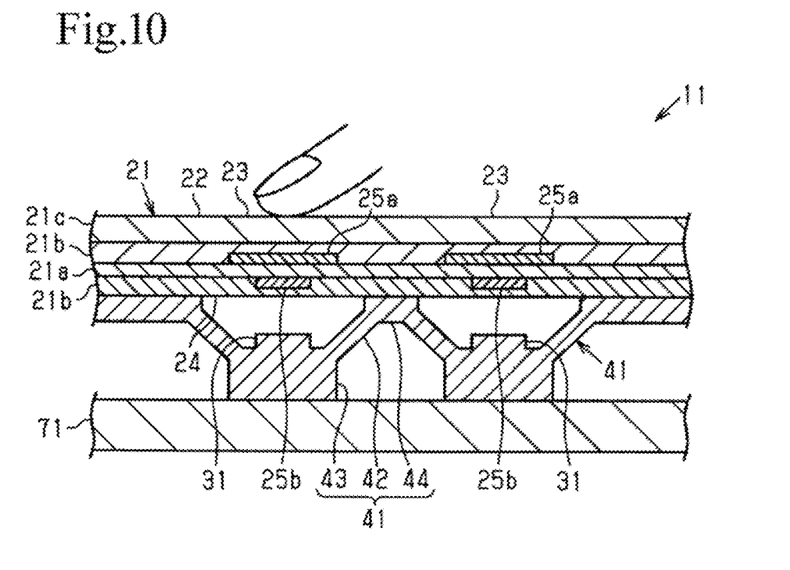
FIG. 10 is a schematic sectional view illustrating an input operation device of a fifth embodiment.

As illustrated in FIG. 10, the detection part 23 of the input operation device 11 of the fifth embodiment includes a first electrode 25a, which generates the first detection value indicating the first operation, and a second electrode 25b, which generates the second detection value indicating the second operation. In the detection part 23, the first electrode 25a and the second electrode 25b are arranged at positions that overlap in plan view viewed from the operation surface 22 side. The first electrode 25a and the second electrode 25b are arranged to be concentric in plan view. Note that the first electrode 25a and the second electrode 25b are arranged to be concentric in plan view additionally with the detection value changing part 31. The first electrode 25a is arranged closer to the operation surface 22 than the second electrode 25b.

The second electrode 25b works as a shield layer for the first electrode 25a. Thus, the detection value of the first electrode 25a, which is generated in response to the first operation, is less likely to be affected by the detection value changing part 31 side, which is opposite to the operation surface 22. In addition, the first electrode 25a works as a shield layer for the second electrode 25b. Thus, the detection value of the second electrode 25b, which is generated in response to the second operation, is less likely to be affected by the operation surface 22 side.

The first electrode 25a is arranged at a position that overlaps the second electrode 25b in plan view. It is preferable that the external shape of the first electrode 25a in plan view be the same as or larger than the external shape of the second electrode 25b. In this case, the detection value of the second electrode 25b is less likely to be affected by a finger touching the operation surface 22; thus, the reliability of detection of the second operation may be further enhanced.

Figure 11:
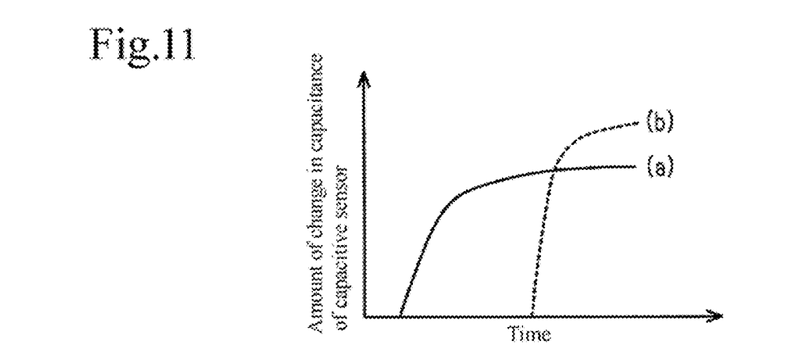
FIG. 11 is a graph that schematically illustrates the relationship between time and the amount of change in capacitance.

A curve (a) in FIG. 11 indicates the relationship between time and the amount Δ of change in capacitance based on the first electrode 25a, and a curve (b) in FIG. 11 indicates the relationship between time and the amount Δ of change in capacitance based on the second electrode 25b. Here, for the convenience of explanation, an example is discussed in which the speed at which the touch sensor part (the operation surface 22) is pressed toward the detection value changing part 31 is constant. The capacitive sensor 12 separately generates the first detection value based on the first electrode 25a and the second detection value based on the second electrode 25b. That is, the input operation device 11 determines the first operation and the second operation on the basis of results that are detected by the separate detection parts 23.

In the fifth embodiment, the following operation and advantageous effects may be achieved in addition to the operation and advantageous effects discussed in the above-described (1-1) to (1-3) paragraphs.

(5-1) The detection part 23 of the input operation device 11 includes the first electrode 25a, which generates the first detection value indicating the first operation, and the second electrode 25b, which generates the second detection value indicating the second operation. In this case, according to the input operation device 11, because the first operation and the second operation are detectable independently, the reliability of detection of the first operation and the second operation may be further enhanced.

Sixth Embodiment

A sixth embodiment of the input operation device 11 will be described by focusing on points that are different from the above-described first embodiment and fifth embodiment.

Figure 12A:
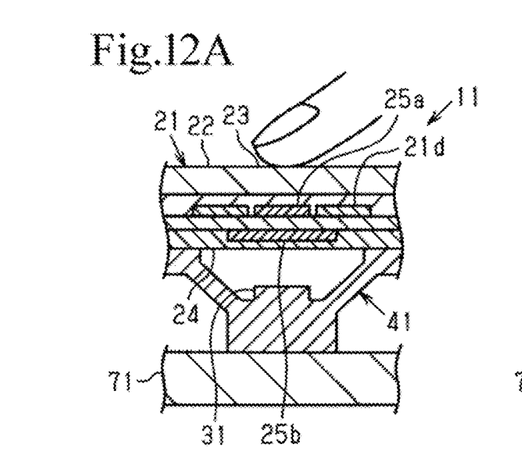
Figure 12B:
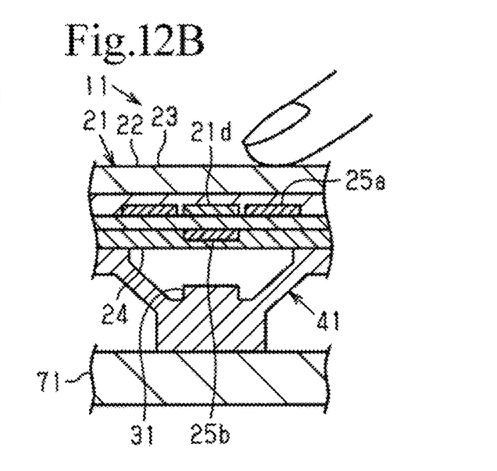
Figure 13A:
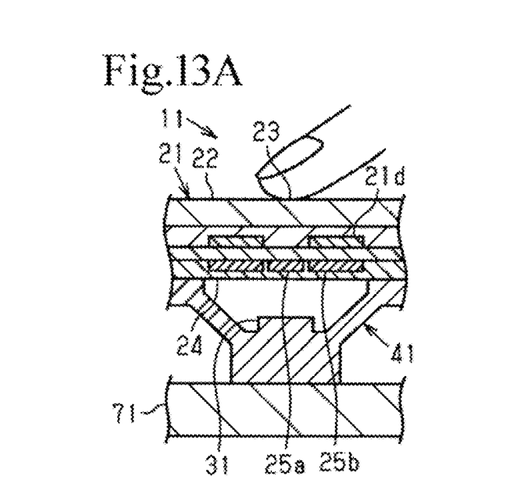
Figure 13B:
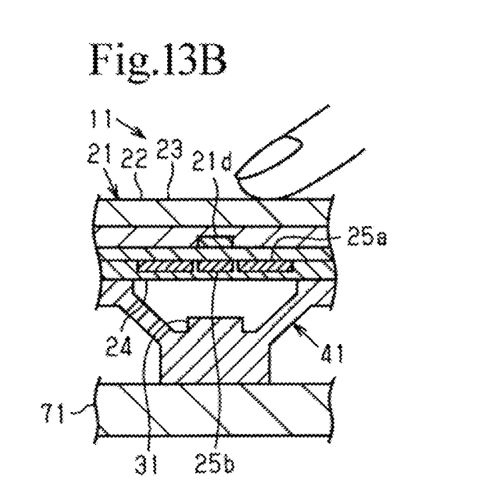

As illustrated in FIGS. 12 and 13, the input operation device 11 of the sixth embodiment includes the first electrode 25a, the second electrode 25b, and a shield layer 21d. The shield layer 21d is made of an electrically conductive material and is connected to ground wiring.

In the input operation device 11 illustrated in part (a) of FIG. 12, the external shape of the first electrode 25a is smaller than the external shape of the second electrode 25b in plan view. In this case, it is preferable to arrange the shield layer 21d to be closer to the operation surface 22 than the second electrode 25b, to overlap the second electrode 25b in plan view of the touch sensor part 21, and to cover a position where the first electrode 25a is not arranged. Thus, the shield layer 21d in part (a) of FIG. 12 is formed to be ring-shaped (doughnut-shaped) in plan view. The shield layer 21d may be made to be larger than the external shape of the second electrode 25b in plan view, and arranged to protrude from the second electrode 25b.

In the input operation device 11 illustrated in part (b) of FIG. 12, the shape of the first electrode 25a is ring-shaped (doughnut-shaped) in plan view, and the shield layer 21d is arranged at a position surrounded by the first electrode 25a in plan view. In this input operation device 11, the second electrode 25b is arranged at a position that overlaps the shield layer 21d in plan view.

In the input operation device 11 illustrated in part (a) of FIG. 13, the shape of the second electrode 25b is ring-shaped (doughnut-shaped) in plan view, and the first electrode 25a is arranged to be surrounded by the second electrode 25b on the same plane as the second electrode 25b. In addition, the input operation device 11 includes the shield layer 21d, which is arranged at a position that overlaps the second electrode 25b in plan view. Here, the shield layer 21d is formed to have the same external shape as the second electrode 25b in plan view. However, the shield layer 21d may be made to be larger than the external shape of the second electrode 25b in plan view.

In the input operation device 11 illustrated in part (b) of FIG. 13, the shape of the first electrode 25a is ring-shaped (doughnut-shaped) in plan view, and the second electrode 25b is arranged to be surrounded by the first electrode 25a on the same plane as the first electrode 25a. In addition, the input operation device 11 includes the shield layer 21d, which is arranged at a position that overlaps the second electrode 25b in plan view. The shield layer 21d in part (b) of FIG. 12 and parts (a) and (b) of FIG. 13 is formed to have the same external shape as the second electrode 25b in plan view, and is arranged to be concentric with the second electrode 25b.

In the sixth embodiment, the following operation and advantageous effects may be achieved in addition to the operation and advantageous effects discussed in the above-described (1-1), (1-2), and (5-1) paragraphs.

(6-1) The input operation device 11 of the present embodiment has the configuration in which the shield layer 21d is arranged to be closer to the operation surface 22 than the second electrode 25b, to overlap the second electrode 25b in plan view of the touch sensor part 21, and to cover a position where the first electrode 25a is not arranged. Accordingly, the detection value of the second electrode 25b on the basis of contact between the detection part 23 and the detection value changing part 31 is less likely to be affected by the operation surface 22 side opposite to the detection value changing part 31. Therefore, according to the input operation device 11, the reliability of detection of the second operation may be enhanced.

Seventh Embodiment

A seventh embodiment of the input operation device 11 will be described by focusing on points that are different from the above-described first embodiment.

Figure 14:
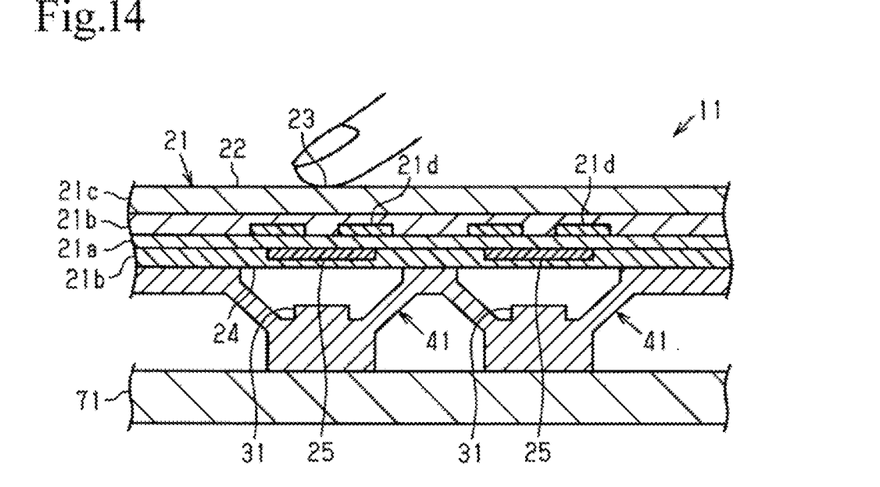
FIG. 14 is a schematic sectional view illustrating an input operation device of a seventh embodiment.

As illustrated in FIG. 14, the touch sensor part 21 of the input operation device 11 of the seventh embodiment includes the shield layer 21d, which is arranged at a position that partially overlaps the electrode 25 of the detection part 23 in plan view. The shield layer 21d is arranged closer to the operation surface 22 than the electrode 25 of the detection part 23. The shield layer 21d arranged as above limits, for the first operation, the detection range of the detection part 23 by limiting the generation range of the first detection value. The shield layer 21d is formed to be ring-shaped. The detection part 23 is configured to be capable of detecting the first operation through the interior of the ring shape of the shield layer 21d. A part of the electrode 25 of the detection part 23 that overlaps the shield layer 21d in plan view is a portion where the first operation is undetectable. It is preferable that the external shape of the shield layer 21d which is ring-shaped in plan view be larger than the external shape of the electrode 25 of the detection part 23.

In this case, because the electrode 25 does not protrude outside the ring shape of the shield layer 21d in plan view, the detection range of the detection part 23 may be more appropriately limited.

Note that the input operation device 11 may have the configuration in which the shape of the shield layer 21d is changed to a different shape other than the ring shape. For example, the input operation device 11 may have the configuration in which one or more line-shaped shield layers are arranged.

In the seventh embodiment, the following operation and advantageous effects may be achieved in addition to the operation and advantageous effects discussed in the above-described (1-1) to (1-3) paragraphs.

(7-1) The touch sensor part 21 of the input operation device 11 includes the shield layer 21d, which is arranged at a position that is closer to the operation surface 22 than the electrode 25 of the detection part 23 and that partially overlaps the electrode 25 of the detection part 23 in plan view of the touch sensor part 21. In this case, it becomes easier to define a detection value generated in response to the first operation of touching the operation surface 22 to be within a certain range. That is, it becomes possible to reduce the amount Δ of change in capacitance when the first operation of touching the operation surface 22 with an operation body is performed to be less than or equal to a certain value. Accordingly, it becomes easier to make the amount Δ of change in capacitance when the second operation of bringing the detection part 23 into contact with the detection value changing part 31 is performed to be different from the amount Δ of change in capacitance when the first operation is performed by making the amount Δ of change in capacitance when the second operation is performed to be greater than or equal to the certain value. Therefore, even if the contact area of a finger on the operation surface 22 increases in the first operation, it becomes less likely to wrongly determine the first operation as the second operation. Thus, according to the input operation device 11, the reliability of determination of the first operation and the second operation may be further enhanced.

(7-2) It is preferable that the shape of the shield layer 21d be ring-shaped in plan view, and that the detection part 23 be configured to be capable of detecting the first operation through the interior of the ring shape of the shield layer 21d. In this case, it becomes even easier to define a detection value detected in response to the first operation to be within a certain range. Therefore, the advantageous effects mentioned in the above-described (7-1) paragraph may be further enhanced.

Eighth Embodiment

An eighth embodiment of the input operation device 11 will be described by focusing on points that are different from the above-described first embodiment.

Figure 15:
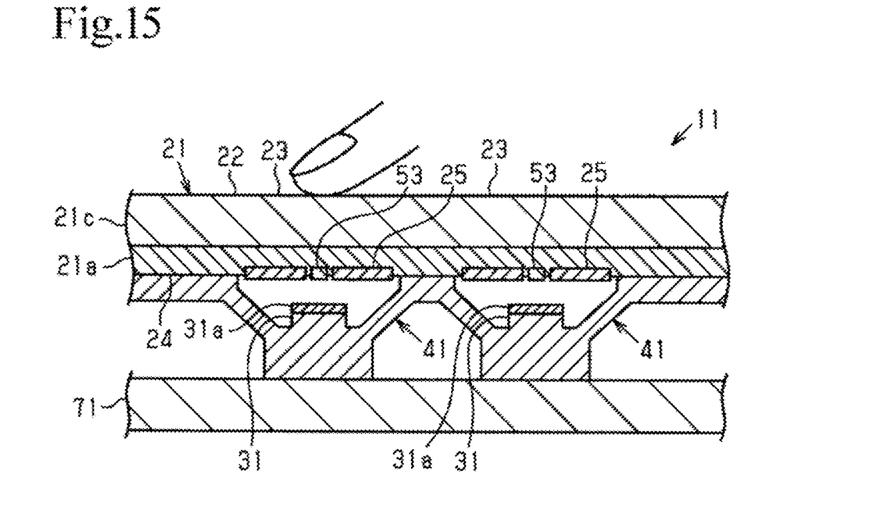
FIG. 15 is a schematic sectional view illustrating an input operation device of an eighth embodiment.

As illustrated in FIG. 15, the touch sensor part 21 of the input operation device 11 of the eighth embodiment includes a ground part 53, which is arranged at a position that faces the detection value changing part 31. The electrode 25 of the detection part 23 is exposed on the back surface 24 (detection value changing part 31 side) of the touch sensor part 21. The tip surface of the detection value changing part 31 includes an electrically conductive layer 31a.

In this input operation device 11, the electrode 25 and the ground part 53 of the detection part 23 are brought into contact with the detection value changing part 31 in response to the second operation. At this time, the electrode 25 of the detection part 23 becomes electrically conductive with the ground part 53, and accordingly, the capacitance (counted capacitance) of the capacitive sensor 12 becomes zero. In this manner, the input operation device 11 may be configured to determine the second operation on the basis of the fact that the detection value of the capacitance becomes zero. Note that the input operation device 11 may have the configuration in which ground wiring connected in advance to the tip surface of the detection value changing part 31 serves as the ground part 53. In addition, the input operation device 11 may have the configuration in which the detection value changing part 31 as a whole is made of an electrically conductive material, and the attachment portion 71 of a housing or the like is configured as the ground part 53.

In the eighth embodiment, the following operation and advantageous effects may be achieved in addition to the operation and advantageous effects discussed in the above-described (1-1) to (1-3) paragraphs.

(8-1) The input operation device 11 includes the ground part 53, which makes the capacitance of the capacitive sensor 12 to be zero when the second operation is performed. In this case, because the input operation device 11 is able to determine the second operation on the basis of the fact that the detection value (capacitance) of the capacitive sensor 12 becomes zero, it becomes less likely to wrongly determine the first operation as the second operation. Accordingly, the input operation device 11 may further enhance the reliability of determination of the first operation and the second operation.

Modifications

The above-described embodiments may be modified and implemented as below. The above-described embodiments and the following modifications may be combined and implemented within a technically consistent range.

The input operation device 11 may have the configuration in which the decoration member 21c of the touch sensor part 21 is omitted.

The above-mentioned input operation device 11 is configured to determine the second operation on the basis of the fact that the detection part 23 contacts the detection value changing part 31. However, the configuration of the input operation device 11 may be changed by, for example, adjusting a threshold or the like to determine the second operation on the basis of the fact that the detection part 23 approaches the detection value changing part 31.

In the above-described input operation device 11, the elastically shape-changeable part 42 buckles and changes shape when the second operation is performed, thereby giving the operator the feel of a click operation. However, the configuration may be changed to allow the elastically shape-changeable part 42 not to give the operator the feel of a click operation.

The shape of the supporting part 41 may be changed to provide the detection value changing part 31 in a portion other than the supporting part 41 (base part 43).

In the above-mentioned input operation device 11, a self-capacitance-type capacitive sensor 12, which detects the amount Δ of change in capacitance, is adopted as the capacitive sensor 12. However, a mutual-capacitance-type capacitive sensor 12 may be adopted in the input operation device 11. The mutual-capacitance-type capacitive sensor 12 generates an electrical field using a transmission electrode and a reception electrode, and detects a change in the electrical field between the transmission and reception electrodes as a detection value. From the viewpoint of further simplifying the configuration of the electrode 25 of the touch sensor part 21, it is preferable to adopt the self-capacitance-type capacitive sensor 12.

The use of the above-described input operation device 11 is not particularly limited, and includes, for example, information device terminal uses, vehicle uses, and audio device uses. In addition, an operation body is not limited to an input operation of touching something with a finger, and an operation pen or the like may be used.

Technical ideas recognizable from the above-described embodiments and modifications will be described.

(a) The input operation device in which the detection part is configured to be capable of performing a slider input, and the first operation includes a slider input.

(b) The input operation device in which the detection part includes a first electrode which detects the first operation and a second electrode which detects the second operation.

(c) The input operation device in which the first electrode and the second electrode are arranged at positions that overlap in plan view viewed from the operation surface side.

REFERENCE SIGNS LIST

11 . . . input operation device, 12 . . . capacitive sensor, 13 . . . controller, 21 . . . touch sensor part, 21d . . . shield layer, 22 . . . operation surface, 23 . . . detection part, 24 . . . back surface, 25 . . . electrode, 25a . . . first electrode, 25b . . . second electrode, 31 . . . detection value changing part, 41 . . . supporting part, 42 . . . elastically shape-changeable part, 43 . . . base part, and 51 . . . light source

The invention claimed is:

1. An input operation device with a capacitive sensor, comprising:
a touch sensor part that includes an operation surface on which an input operation is performed, and a detection part of the capacitive sensor;
a detection value changing part that is arranged on a back surface side opposite to the operation surface of the touch sensor part and that changes a detection value of the capacitive sensor depending on approaching or contact of the detection part; and
a supporting part that supports the touch sensor part in a state in which the detection value changing part and the touch sensor part are separated from each other, wherein:
the supporting part includes
a base part having the detection value changing part,
an elastically shape-changeable part that has a shape that extends from the base part toward the touch sensor part and that elastically changes shape so as to bring the detection part closer to or into contact with the detection value changing part in response to pressing of the operation surface, and
a pressing force receiving part that is provided at one end of the elastically shape-changeable part and that receives pressing force applied from the touch sensor part,
the supporting part is made from a rubbery elastic body as a whole,
the pressing force receiving part extends along and on a back surface of the touch sensor part, and is attached at a position not overlapping the base part in a plan view, and
the capacitive sensor generates a first detection value indicating a first operation of touching the operation surface and a second detection value indicating a second operation of pressing the operation surface toward the detection value changing part.

2. The input operation device according to claim 1, wherein the detection value changing part is surrounded by the elastically shape-changeable part.

3. The input operation device according to claim 1, comprising:
a plurality of the detection parts, a plurality of the supporting parts, and a plurality of the detection value changing parts,
wherein the supporting parts and the detection value changing parts are arranged with correspondence to each of the detection parts.

4. The input operation device according to claim 1, further comprising a light source that illuminates the operation surface in a case in which the first detection value is generated.

5. The input operation device according to claim 1, the elastically shape-changeable part is formed in a buckleable and changeable shape.

6. The input operation device according to claim 1, wherein the elastically shape-changeable part extends from an upper end side of the base part toward the touch sensor part, so that a contact surface of the pressing force receiving part with the touch sensor part is placed above the detection value changing part on the base part.

7. The input operation device according to claim 1, wherein the touch sensor part has a flexible and deformable sheet shape.

8. The input operation device according to claim 1, wherein the detection part includes a plurality of electrodes.

9. The input operation device according to claim 1, wherein the detection part includes a first electrode which generates the first detection value indicating the first operation and a second electrode which generates the second detection value indicating the second operation, and the first electrode and the second electrode are arranged at positions that overlap in a plan view viewed from the operation surface side.

10. The input operation device according to claim 1, wherein the touch sensor part includes a ground part which makes capacitance of the capacitive sensor to be zero when the second operation is performed.

11. An input operation device with a capacitive sensor, comprising:
a touch sensor part that includes an operation surface on which an input operation is performed, and a detection part of the capacitive sensor;
a detection value changing part that is arranged on a back surface side opposite to the operation surface of the touch sensor part and that changes a detection value of the capacitive sensor depending on approaching or contact of the detection part; and
a supporting part that supports the touch sensor part in a state in which the detection value changing part and the touch sensor part are separated from each other, wherein:
the supporting part includes an elastically shape-changeable part that elastically changes shape so as to bring the detection part closer to or into contact with the detection value changing part in response to pressing of the operation surface, and
the capacitive sensor generates a first detection value indicating a first operation of touching the operation surface and a second detection value indicating a second operation of pressing the operation surface toward the detection value changing part, wherein:
the touch sensor part includes a shield layer, and
the shield layer being arranged at a position that is closer to the operation surface than an electrode of the detection part and that partially overlaps the electrode of the detection part in a plan view of the touch sensor part.

12. The input operation device according to claim 11, wherein:
a shape of the shield layer is ring-shaped, and
the capacitive sensor is configured to be capable of generating the first detection value through interior of the ring shape of the shield layer.

13. An input operation device with a capacitive sensor, comprising:
a touch sensor part that includes an operation surface on which an input operation is performed, and a detection part of the capacitive sensor;
a detection value changing part that is arranged on a back surface side opposite to the operation surface of the touch sensor part and that changes a detection value of the capacitive sensor depending on approaching or contact of the detection part; and
a supporting part that supports the touch sensor part in a state in which the detection value changing part and the touch sensor part are separated from each other, wherein:
the supporting part includes an elastically shape-changeable part that elastically changes shape so as to bring the detection part closer to or into contact with the detection value changing part in response to pressing of the operation surface, and
the capacitive sensor generates a first detection value indicating a first operation of touching the operation surface and a second detection value indicating a second operation of pressing the operation surface toward the detection value changing part, wherein:
the capacitive sensor includes a first electrode that generates the first detection value and a second electrode that generates the second detection value, and the touch sensor part includes a shield layer, and
the shield layer being arranged at a position that is closer to the operation surface than the second electrode and that overlaps the second electrode in a plan view of the touch sensor part.

* * * * *